Figure 1:
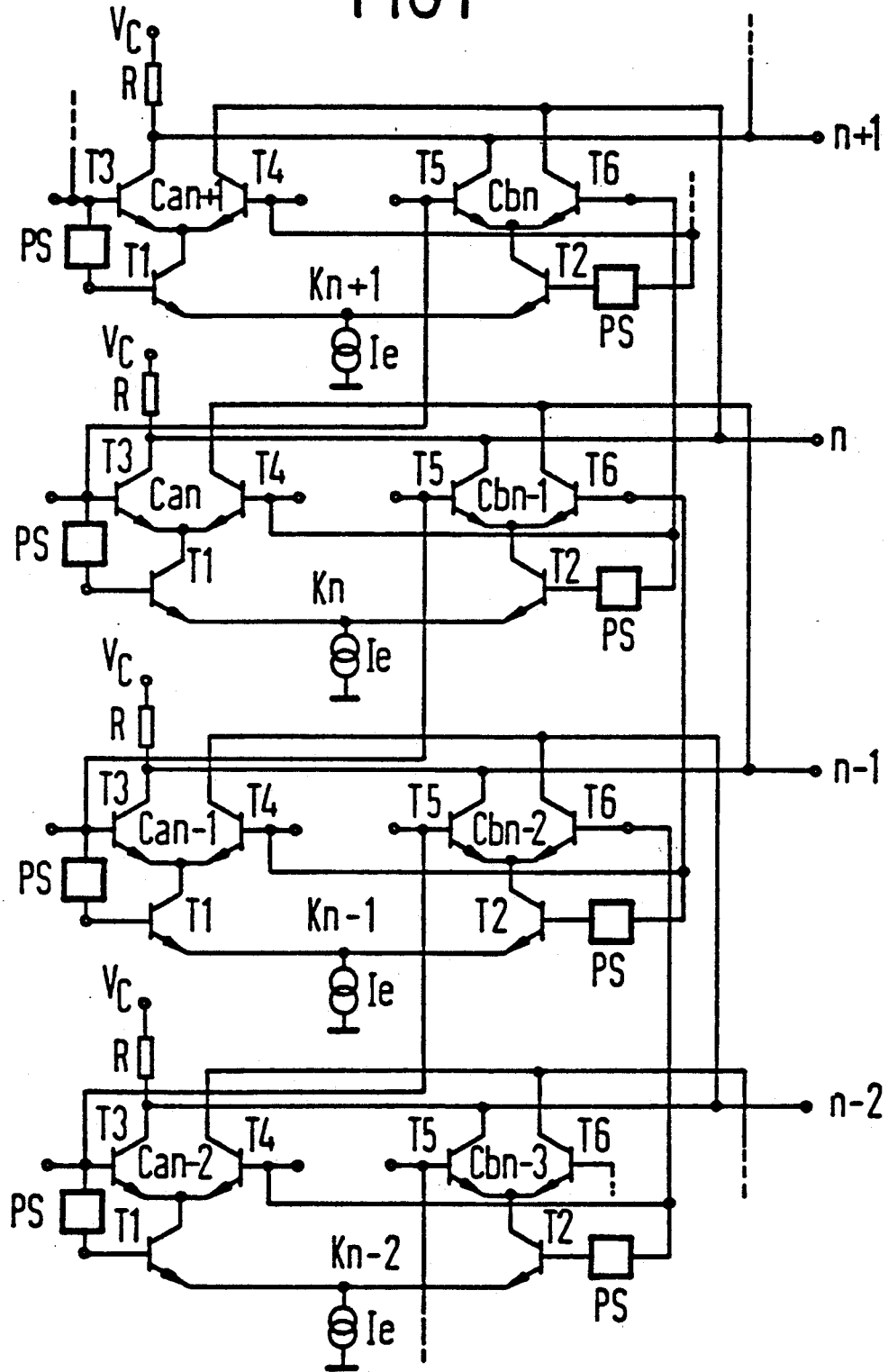

United States Patent [19]

Zojer

[11] Patent Number: 5,272,461
[45] Date of Patent: Dec. 21, 1993

[54] CODING CIRCUIT

[75] Inventor: Bernhard Zojer, Villach, Austria

[73] Assignee: Siemens Aktiengesellschaft, Munich, Fed. Rep. of Germany

[21] Appl. No.: 929,968

[22] Filed: Aug. 14, 1992

[30] Foreign Application Priority Data

Feb. 15, 1990 [DE] Fed. Rep. of Germany ....... 4004735

[51] Int. Cl.[5] .................. H03M 7/22; H03M 1/36
[52] U.S. Cl. ..................... 340/146.2; 307/355; 307/463; 328/119; 341/79; 341/103; 341/159
[58] Field of Search ............... 307/355, 463, 351, 357; 340/146.2; 328/119; 341/50, 79, 94, 102, 103, 159, 96

[56] References Cited

U.S. PATENT DOCUMENTS

| | | | |
|---|---|---|---|
| 3,914,620 | 10/1975 | Millhollan et al. | 307/463 |
| 3,959,791 | 5/1976 | Takahashi et al. | |
| 4,394,657 | 7/1983 | Isogai et al. | 307/463 |
| 4,897,657 | 1/1990 | Brubaker | |

FOREIGN PATENT DOCUMENTS

0120424 3/1983 European Pat. Off.
0282147 2/1987 European Pat. Off.

OTHER PUBLICATIONS

Siemens Forschungs-und Entwicklungsberichte, vol. 15 (1986), No. 2 (Zojer et al.) pp. 68-72.
IEEE Journal of Solid-State Circuits, vol. SC-20, No. 3, Jun. 1985, (Zojer et al.) pp. 780-786.
Halbleiter-Schaltungstechnik, 5th Ed, 1980 pp. 653-664 (Tietze et al.).

*Primary Examiner*—John Zazworsky
*Attorney, Agent, or Firm*—Herbert L. Lerner; Laurence A. Greenberg

[57] ABSTRACT

A coding circuit forming a 1-from-N code from an X-from-N code includes partial circuits in which each position of the X-from-N code forms an input value of a partial circuit. Each partial circuit is formed of three emitter-coupled transistor pairs, a current source connected to reference potential, level shift circuits, signal outputs and a symmetrical signal input. Each partial circuit is connected to the partial circuit with the next higher position of the X-from-N code as an input value and to the partial circuit with the next lower position of the X-from-N code as an input value.

1 Claim, 2 Drawing Sheets

CODING CIRCUIT

CROSS-REFERENCE TO RELATED APPLICATION

This application is a Continuation of International Application No. PCT/DE91/00120, filed Feb. 15, 1991.

The invention relates to a coding circuit which forms a "1-from-N code" from an "X-from-N code", having partial circuits in which each position of the X-from-N code forms an input value of a partial circuit.

Coding circuits are known in which two successive comparator stages are interconnected in an output stage in such a way that a comparator supplying a high signal causes a low signal in its associated output stage, and a comparator supplying a low signal causes a low signal in the next lower output stage, so that only the output stage in the area of the sign change of the comparators supplies a high signal. Such circuits with reverse logic are also known. Such an output stage may also form part of a comparator in that case, as is shown in the publication entitled "Siemens Forschungs- und Entwicklungsberichte" [Siemens Research and Development Reports], Volume 15 (1986), No. 2 in an article entitled "An 8-bit/120 MHz Full-Nyquist Analog-to-Digital Converter" by Zojer and Petschacher, in particular on page 69 in FIG. 2. Given unclear logic input levels in the area of the sign change, such coding circuits have difficulties supplying clear output levels. Particularly at high sampling rates, that leads to a non-negligible error rate due to metastable states. The problem of metastable states is described, inter alia, in an article entitled "A 6-bit/200 MHz Full Nyquist A/D Converter" by Zojer, Petschacher and Luschnig, in the IEEE Journal of Solid-State Circuits, Vol. cs-20, No. 3, June 1985, pages 780 to 786.

A further problem when converting a so-called thermometer code or an X-from-N code supplied by a comparator stage into a so-called 1-from-N code, is the fact that the thermometer code may be incorrect. In other words, individual bit positions of the thermometer code have an incorrect potential. That problem is usually limited by gating more than two comparator output signals in a coding output stage.

The coding circuits described above are usually employed in analog-to-digital converters using the parallel method. Such so-called flash converters are described, inter alia, by Tietze and Schenk in the book "Halbleiterschaltungstechnik" (Semiconductor Circuit Technology), 5th edition 1980, on pages 653 ff, and in particular FIG. 24.26 with the associated description. However, the comparators of the analog signal input stage illustrated therein provide an asymmetrical output signal. Disclosed in Published European Application No. 0 282 147, corresponding to U.S. Pat. No. 4,712,087, is a corresponding analog-to-digital converter circuit with a complex repair circuit which forms an error-free thermometer code from an incorrect thermometer code supplied by comparators with an asymmetrical output signal.

It is accordingly an object of the invention to provide a coding circuit, which overcomes the hereinaforementioned disadvantages of the heretofore-known devices of this general type, which has a low error rate when an incorrect thermometer code occurs or when metastable states occur and which has no additional power consumption in comparison with known circuits.

With the foregoing and other objects in view there is provided, in accordance with the invention, a coding circuit forming a 1-from-N code from an X-from-N code, comprising partial circuits having input values in successively higher and lower positions of an X-from-N code, each of the partial circuits having first, second, third, fourth, fifth and sixth transistors with emitter, base and collector terminals, the first and second transistors forming an emitter-coupled transistor pair, the third and fourth transistors forming an emitter-coupled transistor pair, and the fifth and sixth transistors forming an emitter-coupled transistor pair, a current source connected between the emitter terminals of the first and second transistors and reference potential, the collector terminal of the first transistor being connected to the emitter terminals of the third and fourth transistors, the collector terminal of the second transistor being connected to the emitter terminals of the fifth and sixth transistors, a level shift circuit connected between the base terminal of the third transistor and the base terminal of the first transistor, a further level shift circuit connected between the base terminal of the fourth transistor and the base terminal of the second transistor, the collector terminal of the third transistor and the collector terminal of the fifth transistor together forming a signal output, and the base terminals of the third and fourth transistors together forming a symmetrical signal input; the base terminal of the third transistor of any given one of the partial circuits being connected to the base terminal of the fifth transistor of the partial circuit with the next higher position of the X-from-N code as an input value, the base terminal of the fourth transistor of the given partial circuit being connected to the base terminal of the sixth transistor of the partial circuit with the next higher position of the X-from-N code as an input value, and the collector terminals of the fourth and sixth transistors of the given partial circuit being connected together to the signal output of the partial circuit with the next lower position of the X-from-N code.

Other features which are considered as characteristic for the invention are set forth in the appended claims.

Although the invention is illustrated and described herein as embodied in coding circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
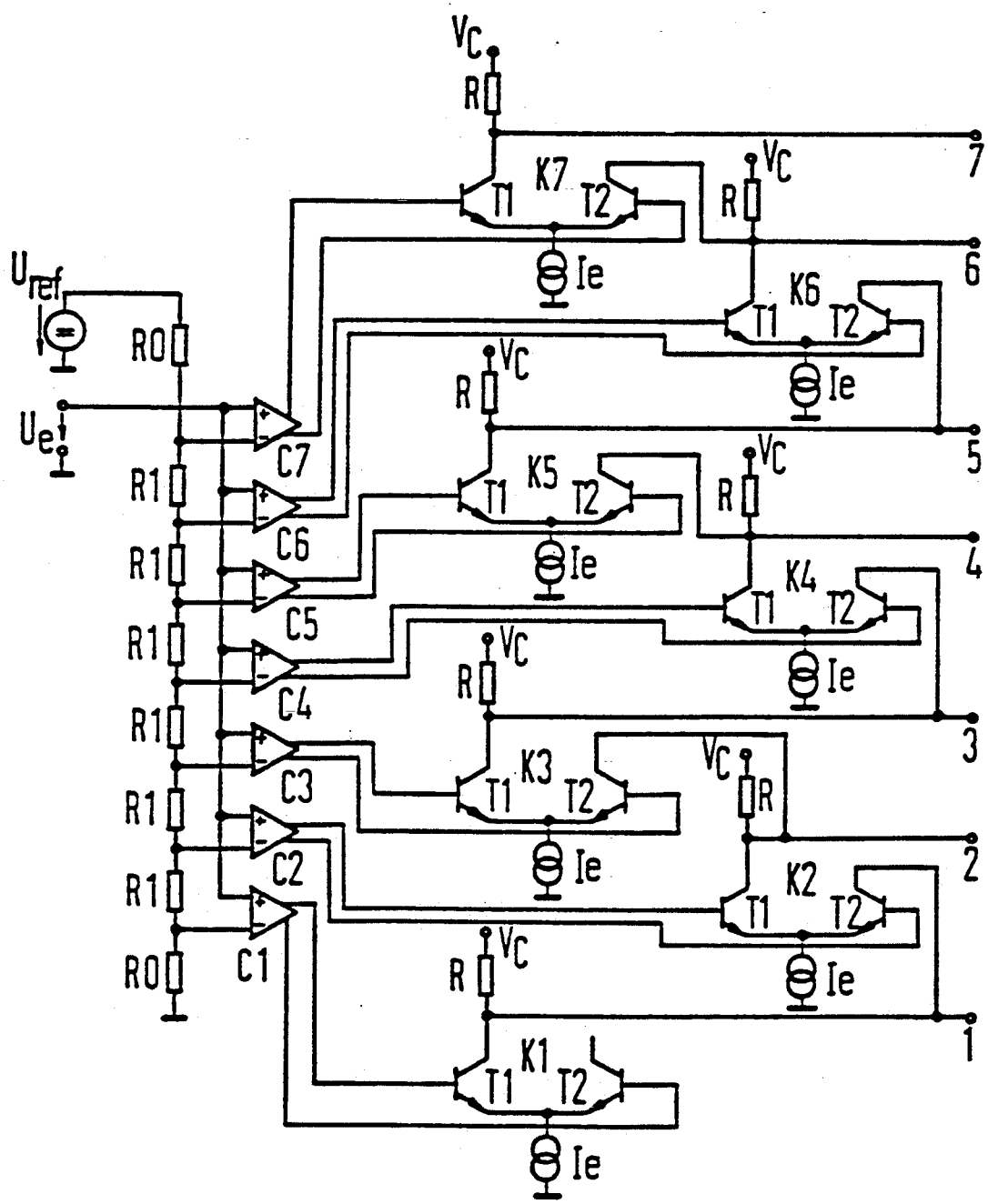

FIG. 1 is a schematic circuit diagram of a coding circuit according to the invention; and FIG. 2 is a circuit diagram of a prior art circuit.

Referring now to the figures of the drawing in detail and first, particularly, to FIG. 2 thereof, there is seen a circuit configuration according to the prior art, in which an output voltage of a reference voltage source $U_{ref}$ is connected to reference potential through a series circuit including a resistor RO, six resistors R1 and a further resistor RO, wherein the resistors RO are preferably dimensioned to be half as large as the resistors R1. In addition, FIG. 2 shows seven comparator circuits C1, C2, C3, C4, C5, C6 and C7 having non-inverting inputs which are interconnected and receive an analog input signal $U_e$, and inverting inputs which are each connected to a different connecting node between two respective resistors R0 and R1, or R1 and R1. The illustrated comparator circuits have symmetrical outputs. In addition, a coding circuit formed of seven partial circuits K1, K2, K3, K4, K5, K6 and K7 is shown. Each respective partial circuit of the coding circuit is formed of a first transistor T1 and a second transistor T2 having emitters which are interconnected and are connected through a current source Ie to reference potential. The collector terminal of each respective transistor T1 is connected through a resistor R to a supply potential VC and in each case forms a signal output 1, 2, 3, 4, 5, 6 or 7 of the partial circuit. The base terminals of the transistors T1 and T2 of each respective partial circuit K1, K2, K3, K4,... are connected to the symmetrical signal output of one of the comparator circuits C1, C2, C3,... so that each respective partial circuit K1, K2,... of the coding circuit evaluates the output signal of a specific comparator C1, C2,.... The collector terminal of the transistor T2 of each respective partial circuit is connected to the signal output of the partial circuit which is driven by the comparator C1, C2,... with the next lower switching threshold. The collector terminal of the transistor T2 of the partial circuit K1 receives a supply potential, possibly through a resistor that is not illustrated. In the case of the partial circuits K1, K2,... that are illustrated, a logic 1 at the input signifies that the transistor T1 is driven with a low level and the transistor T2 is driven with a high level.

FIG. 1 shows a coding circuit according to the invention as an exemplary embodiment for systems with a symmetrical input being formed of a plurality of differential amplifier circuits..., Kn−1, Kn, Kn+1,.... In this exemplary embodiment, each differential amplifier circuit is formed of a first transistor T1 and second transistor T2 having emitters which are jointly connected through a current source Ie to reference potential. Coding stages in the form of emitter-coupled transistor pairs are connected in the collector circuits of the differential amplifier transistors T1 and T2. Connected to the collector terminal of the transistor T1 of the differential amplifier Kn is the emitter terminal of a transistor T3 and the emitter terminal of a transistor T4, which together form a part Can of a coding stage. The collector terminal of the transistor T3 is connected through a resistor R to a supply potential $V_C$. The collector terminal of the transistor T2 of the differential amplifier Kn is connected to the emitter terminal of a transistor T5 and to the emitter terminal of a transistor T6, which form a part of a coding stage Cbn−1. The collector terminal of the transistor T5 is connected to the collector terminal of the transistor T3 of one stage and also to the collector terminals of the transistors T6 and T4 of the higher stage, which is connected to the differential amplifier Kn+1, and forms a signal output n of the partial circuit including the differential amplifier Kn and the coding stages Can and Cbn−1. The collector terminals of the transistors T4 and T6 which are assigned to the differential amplifier Kn are connected to the collector terminals of the transistors T5 and T3 of the next lower stage, which is assigned to the differential amplifier Kn−1, and form the signal output n-1 of the partial circuit including the differential amplifier Kn−1 and the coding stages Can−1 and Cbn−2. The other adjoining stages are connected analogously.

The base terminals of the transistors T3 and T4 in each case form the signal input of a partial circuit of the coding circuit. The base terminal of the transistor T3 of the coding stage Can is interconnected with the base terminal of the transistor T5 of the coding stage Cbn, and in addition it is connected through a level shift circuit PS to the base terminal of the transistor T1 of the differential amplifier Kn. The base terminal of the transistor T4 of the coding stage Can is interconnected with the base terminal of the transistor T6 of the coding stage Cbn and it is connected through a further level shift circuit PS to the base terminal of the transistor T2 of the differential amplifier stage Kn.

In the same way, the base terminal of the transistor T3 of the coding stage Can−1 is interconnected with the base terminal of the transistor T5 of the coding stage Cbn−1 and in addition is connected through a level shift circuit PS to the base terminal of the transistor T1 of the differential amplifier Kn−1. In addition, the base terminal of the transistor T4 of the coding stage Can−1 is interconnected with the base terminal of the transistor T6 of the coding stage Cbn−1 and is connected through a level shift circuit PS to the base terminal of the transistor T2 of the differential amplifier Kn−1. The base terminals of the remaining stages are connected analogously.

Coding circuits according to the invention serve, inter alia, as an output stage for a wide variety of comparator circuits in an analog-to-digital converter and convert a "thermometer code" provided by the comparator circuits into a "1-from-N code". During normal operation, the individual input signals of a coding circuit according to the invention consequently have a specific polarity below a specific partial circuit of the coding circuit, for example below the partial circuit formed by the differential amplifier Kn and the coding stages Can and Cbn−1, and have the opposite polarity thereto above the partial circuit. In this case it should be ensured that the coding stage Cbn of the partial circuit Can+1, Cbn and Kn+1 is driven with the same signal as the coding stage Can and the differential amplifier Kn. However, in this case the input signal of the differential amplifier Kn differs from the input signal of the coding stages Can and Cbn by a fixed voltage value, which can be accomplished with a level shift circuit PS.

The other differential amplifiers..., Kn−2, Kn−1, Kn, Kn+1,... are also driven in accordance with their indexing by the same input signal as the coding stages..., Can−2, Can−1, Can, Can+1... and the coding stages..., Cbn−3, Cbn−2, Cbn−1, Cbn,..., with there being a fixed direct voltage difference in each case between the same symmetrical input signal which drives a differential amplifier circuit, for example Kn−1, and correspondingly indexed coding stages, for example Can−1 and Cbn−1. In detail, therefore, the same signal level as at the base terminal of the transistor T5 of the coding stage Cbn is present at the base terminal of the transistor T3 of the coding stage Can, and the same signal is present at the base terminal of the transistor T1 of the differential amplifier Kn, shifted by an additive direct voltage component. Likewise, the same signal level as at the base terminal of the transistor T6 of the coding stage Cbn is present at the base terminal of the transistor T4 of the coding stage Can, and in addition the signal is also present at the base terminal of the transistor T2 of the differential amplifier Kn, shifted by the aforesaid direct voltage component.

The current across a resistor R of each partial circuit of the coding circuit which defines the polarity of the output signal of the partial circuit, is thus defined both by the input signal of the differential amplifier of the partial circuit itself and by the input signals of the differential amplifiers of the two neighboring partial circuits.

If a metastable state occurs at the inputs of the differential amplifier Kn as well as the coding stages Can and Cbn, so that only a current of a quarter Ie flows across the transistor T3 of the coding stage part Can, for example, then the coding stages of the next lower differential amplifier stage are supplied with three-quarters of this current, with the result that a clear switching state is ensured.

If an incorrect "thermometer code" is present at the inputs of the differential amplifier stages and the coding stages, then such a circuit supplies a clear "1-from-N code", that is to say either a current Ie or no current flows across the resistors R.

Circuit configurations according to the invention are distinguished from circuit configurations according to the prior art by a lower power consumption. A circuit configuration according to the invention namely requires the same current as a circuit configuration according to the prior art as is shown in FIG. 2, despite the fact that the latter circuit configuration does not perform any error corrections.

I claim:

1. A coding circuit forming a 1-from-N code from a thermometer code, comprising:

partial circuits having input values each corresponding to successively higher and lower positions of a thermometer code, each of said partial circuits having:

first, second, third, fourth, fifth and sixth transistors with emitter, base and collector terminals, said first and second transistors forming an emitter-coupled transistor pair, said third and fourth transistors forming an emitter-coupled transistor pair, and said fifth and sixth transistors forming an emitter-coupled transistor pair, a current source connected between the emitter terminals of said first and second transistors and reference potential, the collector terminal of said first transistor being connected to the emitter terminals of said third and fourth transistors, the collector terminal of said second transistor being connected to the emitter terminals of said fifth and sixth transistors, a level shift circuit connected between the base terminal of said third transistor and the base terminal of said first transistor, a further level shift circuit connected between the base terminal of said fourth transistor and the base terminal of said second transistor, the collector terminal of said third transistor and the collector terminal of said fifth transistor together forming a signal output, and the base terminals of said third and fourth transistors together forming a symmetrical signal input;

the base terminal of said third transistor of any given one of said partial circuits being connected to the base terminal of said fifth transistor of said partial circuit with the next higher position of the thermometer code as an input value, the base terminal of said fourth transistor of said given partial circuit being connected to the base terminal of said sixth transistor of said partial circuit with the next higher position of the thermometer code as an input value, and the collector terminals of said fourth and sixth transistors of said given partial circuit being connected together to the signal output of said partial circuit with the next lower position of the thermometer code.

* * * * *